United States Patent [19]

Takeda et al.

[11] Patent Number: 5,141,881
[45] Date of Patent: Aug. 25, 1992

[54] METHOD FOR MANUFACTURING A SEMICONDUCTOR INTEGRATED CIRCUIT

[75] Inventors: Kazuo Takeda; Toshimasa Sadakata, both of Outa; Teruo Tabata, Gunma; Nobuyuki Sekikawa, Gunma; Tadayoshi Takada, Gunma; Yasuhiro Tamada, Ojiya; Yoshiaki Sano, Gunma, all of Japan

[73] Assignee: Sanyo Electric Co., Ltd., Osaka, Japan

[21] Appl. No.: 510,469

[22] Filed: Apr. 18, 1990

[30] Foreign Application Priority Data

Apr. 20, 1989 [JP] Japan .................................. 1-100782
May 19, 1989 [JP] Japan .................................. 1-127316
May 19, 1989 [JP] Japan .................................. 1-127320
May 19, 1989 [JP] Japan .................................. 1-127321
May 19, 1989 [JP] Japan .................................. 1-127322

[51] Int. Cl.⁵ .................................................. H01L 21/22
[52] U.S. Cl. ........................................ 437/31; 437/59; 437/76; 148/DIG. 9; 148/DIG. 10
[58] Field of Search .................... 437/31, 59, 76; 148/DIG. 9, DIG. 10

[56] References Cited

U.S. PATENT DOCUMENTS

| | | | |
|---|---|---|---|
| 3,730,786 | 5/1973 | Ghosh | 437/76 |
| 4,826,780 | 5/1989 | Takemoto | 437/76 |
| 4,914,051 | 4/1990 | Huie | 437/31 |

FOREIGN PATENT DOCUMENTS

| | | |
|---|---|---|
| 54-87748 | 6/1979 | Japan . |
| 0015943 | 1/1985 | Japan .................................. 437/76 |
| 61-44892 | 3/1986 | Japan . |
| 62-37737 | 9/1987 | Japan . |
| 1-290454 | 11/1989 | Japan . |

OTHER PUBLICATIONS

IBM Technical Disclosure Bulletin, vol. 20, No. 12 May 1978, pp. 5175-5177.

Primary Examiner—Olik Chaudhuri
Assistant Examiner—Ourmazd S. Ojan
Attorney, Agent, or Firm—Spensley Horn Jubas & Lubitz

[57] ABSTRACT

A method of making a semiconductor integrated circuit provided with an isolating region constituted of an upper and lower isolating regions, and integrated circuit element regions is disclosed, wherein: the lower isolating region is diffused upward to a depth of a little more than half the thickness of an epitaxial layer to link with the upper isolating region prior to a doping of the upper isolating region; the doping of the lower isolating region and integrated circuit element regions, is implemented by means of ion implantation through a resist film which is capable of blocking ions implanted and in which specified doping windows have been formed in advance, and a $SiO_2$ film is used as a reference mask in an ion implanting step, and the respective borders of the upper isolating region and the specified regions of the circuit elements is determined by self-alignment. The method has advantages that the upper isolating region can be prepared by heat-treatment for relatively short time, reducing lateral diffusion and the occupied area thereof, and slippage by masking is remarkably reduced, providing a semiconductor integrated circuit with high density.

12 Claims, 13 Drawing Sheets

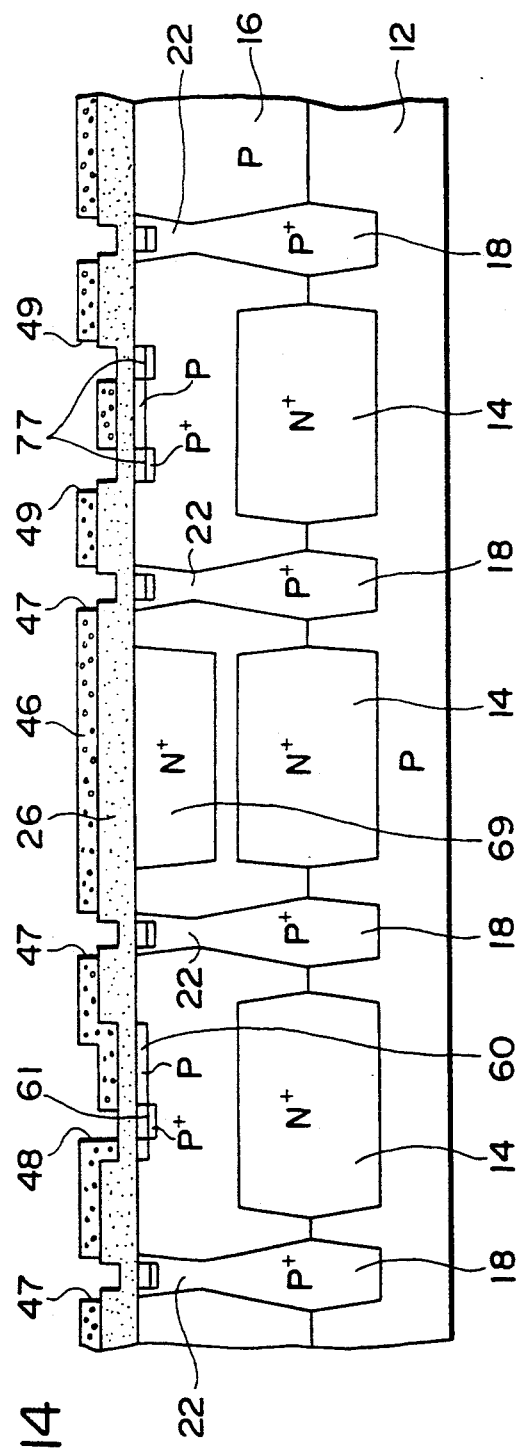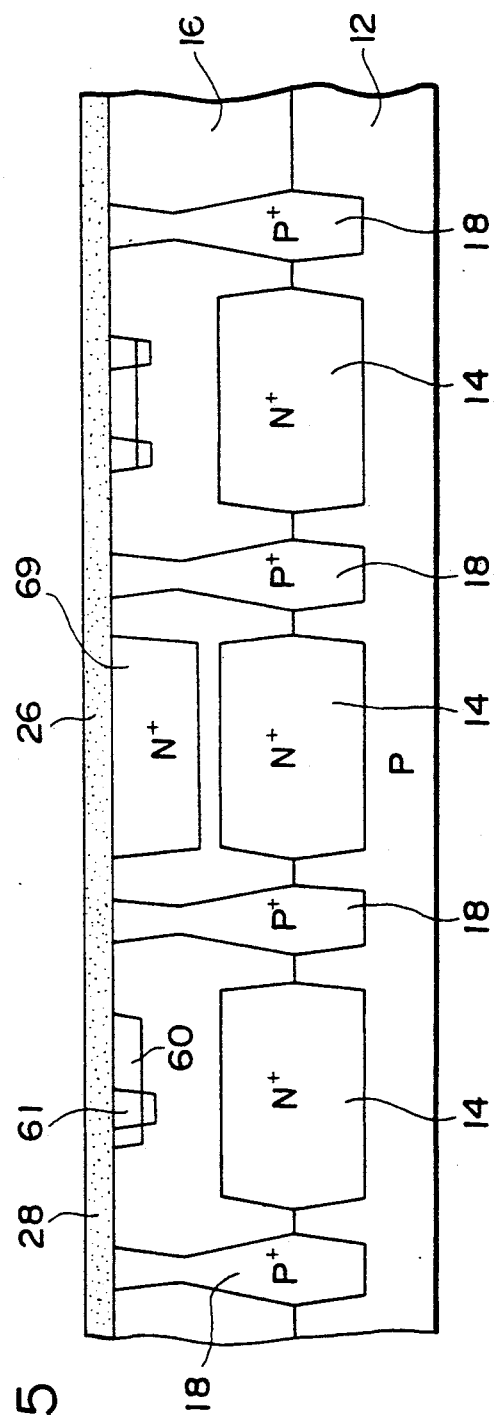
FIG. 14
FIG. 15

METHOD FOR MANUFACTURING A SEMICONDUCTOR INTEGRATED CIRCUIT

BACKGROUND OF THE INVENTION

1. Field of the Invention

The present invention relates to a method for manufacturing a semiconductor integrated circuit whereby a high degree of integration can be achieved, and, in particular, to a method for manufacturing a semiconductor integrated circuit whereby the area of the surface occupied by an isolating region can be limited and self-alignment of the isolating region and the integrated circuit element regions is assured.

2. Description of the Background Art

At the present time, a method considered to be one of the most effective isolation methods among the methods of electrically isolating the various integrated circuit elements formed on a semiconductor integrated circuit substrate is the vertical isolation method disclosed in Japanese Patent Laid-Open No. 136250/1985.

In this vertical isolation method, first, as shown in FIG. 1, an N+-type buried region 81 is formed by selectively depositing antimony (Sb) on a semiconductor substrate 80 for which a P-type silicon substrate is used. Next, a lower isolating region 83 is formed by selectively depositing boron (B) on the surface of the substrate 80, enclosing the N+-type buried region 81.

Following this, as shown in FIG. 2, an N−-type epitaxial layer 85 is formed to a specified thickness over the entire surface of the semiconductor substrate 80 by the commonly known vapor growth method. At this time, the buried region 81 and the lower isolating region 83 are slightly diffused to a vertical direction.

Then, as shown in FIG. 3, by means of a diffusion method, an upper isolating region 84 is formed by selective diffusion from the surface of the epitaxial layer 85, and simultaneously a lower isolating region 83 is diffused upward from the surface of the semiconductor substrate 80, linking to the isolating region 84 to form an isolating region 82.

This diffusion method is carried out at about 1,200° C. over three to four hours. When the thickness of the epitaxial layer 85 is 13 μm, the upper isolating region 84 is diffused to a depth of about 10 μm, and the lower isolating region 83 is diffused upward to a depth of about 5 μm. Because the diffused region 82 is also diffused from the diffusing window surface in the lateral direction in proportion to the diffusion depth, the width of the isolating region 82 eventually reaches about 24 μm at the surface of the epitaxial layer 85 and about 14 μm at the surface of the semiconductor substrate. At this time the buried region 81 also is diffused to a depth of about 4 μm.

Then, as shown in FIG. 4, a P-type base region 87 is produced by selective diffusion in an island 86 formed by the epitaxial layer 85 which is enclosed by the isolating region 82, followed by forming an N+-type emitter region 88 and a collector contact region 89 by selective diffusion to provide an NPN-type transistor.

Because the lateral diffusion at the surface of the epitaxial layer is suppressed, the above-mentioned vertical isolation method has the feature of being able to form extremely fine semiconductor integrated circuits in comparison with the method of forming an isolating region by diffusion from an epitaxial layer surface only. However, because the upper and lower isolating regions 84, 83 of the isolating region 82 are simultaneously formed by diffusion, it is necessary to diffuse the upper isolating region 84 to a moderately greater depth than the lower isolating region 83 in consideration of, such as, impurity concentration or the like. For this reason, the time for diffusion is lengthened by three to four hours and the lateral diffusion of the upper isolating region 84 increases, so that the surface area of the epitaxial layer 85 is largely occupied by the upper isolating region 84. This method has thus a drawback of insufficient improvement in a degree of integration.

Furthermore, in a method of forming the upper isolating region 84 shown in FIG. 3 and the base region 87 shown in FIG. 4 by diffusion, first a doping window (a window for the introduction of dopant) is formed, and the dopant is diffused from this doping window. For this reason, the position of this doping window is deviated from the right position in the alignment of a photo mask and in the etching. This is a second drawback of this method.

The configuration of and a manufacturing method for a bipolar transistor were also discussed in detail in the *Latest LSI Process Technology*, Apr. 25, 1984 published by Industrial Board of Inquiry.

FIG. 5 shows the configuration of the bipolar transistor disclosed in the above literature. This bipolar transistor comprises a collector region 94 which is an island itself formed from a lower isolating region 92 and an upper isolating region 93 in an N-type epitaxial layer 91, a P-type base region 95 formed within this island, and an N+-type emitter region 96 formed within the base region 95.

This type of bipolar transistor is manufactured by a method comprising:

a first step, wherein an SiO$_2$ film is formed on a P-type semiconductor substrate 90, a doping window for the buried layer 92 is formed in the SiO$_2$ film, and antimony is selectively doped in the P-type semiconductor substrate 90 through the doping window;

a second step, wherein an SiO$_2$ film is again formed on the P-type semiconductor substrate 90, a doping window for the lower isolating region 92 is formed in this SiO$_2$ film, and the semiconductor substrate 90 is selectively doped with boron through the doping window;

a third step, wherein, after the epitaxial layer 91 is grown on the surface of the semiconductor substrate 90, a SiO$_2$ film is formed on the surface of the epitaxial layer 91;

a fourth step, wherein a doping window for the upper isolating region 93 is formed in the SiO$_2$ film on the surface of the epitaxial layer 91, and the epitaxial layer 91 is selectively doped with boron through the doping window;

a fifth step, wherein the semiconductor substrate 90 is heat-treated, the various regions which were doped in the foregoing steps are diffused, and the lower isolating region 92 and the upper isolating region 93 are linked;

a sixth step, wherein a doping window for the base region 95 is formed in the SiO$_2$ film on the surface of the epitaxial layer 91, the epitaxial layer 91 is selectively doped with boron through the doping window to form a base region 95; and a seventh step, wherein doping windows for the emitter region 96 and for a collector contact region 97 are formed in the SiO$_2$ film on the surface of the epitaxial layer 91, and the epitaxial layer 91 is doped with phosphorous (P) through the doping window to form the emitter region 96 and the collector contact region 97.

However, because the upper isolating region 93, the base region 95, and the collector contact region 97 formed in the fourth, sixth, and seventh steps are selectively doped through different SiO₂ films, there is concern that the positions which these regions occupy will deviate from the design values, as shown by the dotted lines in FIG. 5, because of the mask alignment required to form the doping windows in each SiO₂ film or because of the subsequent etching. For this reason, the spacing of these regions must be designed to provide a preset allowance so that contact between these regions from the diffusion treatment is avoided. This is an obstacle to high integration.

In addition, when the depth of diffusion of the upper isolating region 93 reaches 10 μm, the upper isolating region 93 also extends to the same extent in the lateral direction. Because of this, the each length of the spacings of the upper isolating region 93 and the other regions must exceed the length of the diffusion depth of the upper isolating region 93 by about 2 μm of a margin. This interferes with the degree of integration of the semiconductor integrated circuit.

SUMMARY OF THE INVENTION

A first object of the present invention is to provide a method for manufacturing a semiconductor integrated circuit whereby a high degree of integration can be achieved, comprising a provision of a method for forming an upper isolating region wherein an adequate diffusion distance in the vertical direction is obtained by a relatively short heat treatment and the lateral diffusion effect is resultantly suppressed.

A second object of the present invention is to provide a method for manufacturing a semiconductor integrated circuit whereby a high degree of integration can be achieved, comprising a provision of a process for forming an isolating region wherein the diffusion distance of a lower isolating region and the diffusion distance of an upper isolating region can be designed independently whereby the exclusive area of the upper isolating region in a substrate surface can be restrained.

A third object of the present invention is to provide a method for manufacturing a semiconductor integrated circuit whereby a high degree of integration can be achieved, comprising a provision of a process for forming an isolating region wherein slippage of a mask for an upper isolating region can be tolerated, the upper isolating region and a lower isolating region are easily linked, and a complete isolation of junction is obtained.

A fourth object of the present invention is to provide a method for manufacturing a semiconductor integrated circuit whereby a high degree of integration can be achieved, wherein self-alignment of an upper isolating region and other regions for essential elements, such as a resistance element, a MOS capacitive element or the like is assured.

A fifth object of the present invention is to provide a method for manufacturing a semiconductor integrated circuit whereby a high degree of integration can be achieved, wherein self-alignment of an upper isolating region and a base region of a transistor is assured.

A sixth object of the present invention is to provide a method for manufacturing a semiconductor integrated circuit wherein the number of masking steps is reduced, eliminating the problems of the contamination of and damage to the semiconductor substrate.

A seventh object of the present invention is to provide a method for manufacturing a semiconductor integrated circuit whereby a high degree of integration can be achieved, wherein self-alignment of an upper isolating region and a collector contact region or the like is assured.

An eighth object of the present invention is to provide a method for manufacturing a semiconductor integrated circuit wherein the film thickness at the positions required for openings in an SiO₂ film is entirely even, and accordingly, when the opening is made, there is no concern about side etching of the SiO₂ film or of etching of the element region.

A ninth object of the present invention is to provide a method for manufacturing a semiconductor integrated circuit wherein an ion implantation into the epitaxial layer is carried out uniformly without damages.

The first object of the present invention is achieved by a first embodiment comprising steps of:

(i) forming a lower isolating region constituting one side of an isolating region between a semiconductor substrate and an epitaxial layer formed on the semiconductor substrate;

(ii) forming a mask layer on the surface of the epitaxial layer and opening a portion of the mask layer for the lower isolating region to form a doping window;

(iii) ion implanting an impurity into the epitaxial layer through the doping window to selectively form an upper isolating region constituting the other side of the isolating region;

(iv) diffusing the upper isolating region to link the lower isolating region with the upper isolating region.

By the first embodiment of the present invention wherein the doping of the upper isolating region is performed by means of ion implantation, the impurity distribution of the upper isolating region immediately after the ion implantation retrogrades, possibly reducing the width of the upper isolating region in the epitaxial layer which reaches its maximum width by the subsequent diffusion step. Accordingly, a high degree of integration of a semiconductor integrated circuit is achieved. In addition, because of the retrograding of the distribution of the dopant in the upper isolating region, the upper and lower isolating regions are linked by means of a diffusion step at a low temperature for a relatively short time, whereby the width of the upper isolating region on the surface of the epitaxial layer can be reduced, and accordingly, a semiconductor integrated circuit with a high degree of integration is achieved.

The first to third objects of the present invention can be achieved by a second embodiment comprising steps of:

(i) forming a lower isolating region constituting one side of an isolating region between a semiconductor substrate and an epitaxial layer formed on the semiconductor substrate;

(ii) diffusing the lower isolating region in a specified condition;

(iii) forming a first mask layer on the surface of the epitaxial layer and opening a portion of the first mask layer for the lower isolating region to form a doping window;

(iv) ion implanting an impurity into the epitaxial layer through the doping window of the first mask layer to form an upper isolating region constituting the other side of the isolating region;

(v) diffusing the upper isolating region to link the lower isolating region with the upper isolating region.

In the second embodiment of the present invention, because the upper and lower isolating regions are formed by different diffusion processes respectively, the respective diffusion conditions can optionally be designed so that the diffusion of the lower isolating region is deepened and the diffusion of the upper isolating region is shallowed. By these means, the lateral diffusion of the upper isolating region can be restrained, and it is possible to curtail the width of the exclusive surface area of the upper isolating region which affects the degree of integration of the semiconductor integrated circuit. Also, because the lower isolating region is designed with a large cross section which is formed by a longer period of diffusion than that used for the upper isolating region, a small amount of slippage of the mask which is formed during the formation period of the upper isolating region can be tolerated. In addition, the upper isolating region and a lower isolating region are easily linked, and a complete isolation of junction is obtained.

The first to fourth objects of the present invention can be achieved by a third embodiment comprising steps of:

(i) forming a lower isolating region constituting one side of an isolating region between a semiconductor substrate and an epitaxial layer formed on the semiconductor substrate;

(ii) diffusing the lower isolating region in a specified condition;

(iii) forming a first mask layer on the surface of the epitaxial layer, and opening portions of the first mask layer for the lower isolating region and integrated circuit element regions respectively to form each doping window;

(iv) forming a second mask layer on the first mask layer, and opening portions of the second mask layer for at least one of the doping windows of the first mask layer to form each doping window;

(v) ion implanting into the epitaxial layer through the first and second mask layers to form the upper isolating region or the integrated circuit element region, or the both; and (vi) diffusing the upper isolating region to link the lower isolating region with the upper isolating region.

In the third embodiment of the present invention, because the positions of the respective impurity introduction windows are set in advance and the positions at which the upper isolating region and a base region, and a diffused resistance region are formed are principally determined by using a single SiO$_2$ film which may be called a reference mask, the spacing margin of the upper isolating region and the base region or the diffused resistance region can be set to an extremely small size. In addition, by the present embodiment in which the number of masking steps is reduced, the problems of contamination of and damages to the semiconductor substrate during the manufacturing stage are eliminated.

Also, the present embodiment, in which ion implantation is carried out via the SiO$_2$ film reference mask and the resist film, has the advantage that slippage of the mask pattern for the resist film and the SiO$_2$ film can be tolerated. Because the ions which are implanted from the opening in the resist film are finally implanted in the surface of the epitaxial layer according to the mask pattern of the SiO$_2$ film, the resist layer is adequate only if it has the function of shielding the doping windows of the base region and the diffused resistance region, providing the advantage that a precise mask alignment is unnecessary.

The first to third objects and the fifth object of the present invention can be achieved by a fourth embodiment comprising the following steps:

(i) forming a lower isolating region constituting one side of an isolating region between a semiconductor substrate and an epitaxial layer formed on the semiconductor substrate;

(ii) diffusing upward the lower isolating region to a depth of a little more than half the thickness of the epitaxial layer;

(iii) forming a first mask layer on the surface of the epitaxial layer, and opening portions of the first mask layer for the upper isolating region at least and a base region of a transistor to form each doping window;

(iv) forming a second mask layer on the first mask layer, and opening a portion of the first mask layer for the upper isolating region to form a doping window;

(v) ion implanting into the epitaxial layer through the doping window of the first and second mask layers to form the upper isolating region;

(vi) forming a third mask layer on the first mask layer after removing the second mask layer, and opening portions of the third mask layer for at least the base region of the transistor to form each doping window;

(vii) doping the epitaxial layer with an impurity to form at least the base region of the transistor.

Specifically, by the fourth embodiment of the present invention, in addition to the effects previously outlined, the self-alignment of an upper isolating region and other regions is assured, and it is unnecessary to provide excess spacing between the upper isolating region and the other regions. The degree of integration of the semiconductor integrated circuits is increased. This embodiment has a great effect on improving a degree of integration, especially, of transistors.

By a modification of this invention wherein all the necessary impurity introduction windows are formed in advance in an SiO$_2$ film which may be called a reference mask, excellent etching of the SiO$_2$ film is obtained when, for example, the collector contact region and other contact regions are formed.

In all embodiments of this invention, because dummy oxide films are formed in the SiO$_2$ film which may be called a reference mask, damage to the epitaxial layer from subsequent ion implantation is minimized and uniform implantation can be attained.

Other objects, features and advantages of the invention will hereinafter become more readily apparent from the following description.

BRIEF DESCRIPTION OF THE DRAWINGS

FIG. 6 to FIG. 18 are sectional drawings of a semiconductor integrated circuit substrate illustrative of each respective step in the method of manufacturing a semiconductor integrated circuit of the present convention. FIG. 13 is a drawing explaining the modification of steps in the manufacture of an embodiment illustrated in FIG. 12.

DETAILED DESCRIPTION OF THE INVENTION AND PREFERRED EMBODIMENTS

Figure 18:
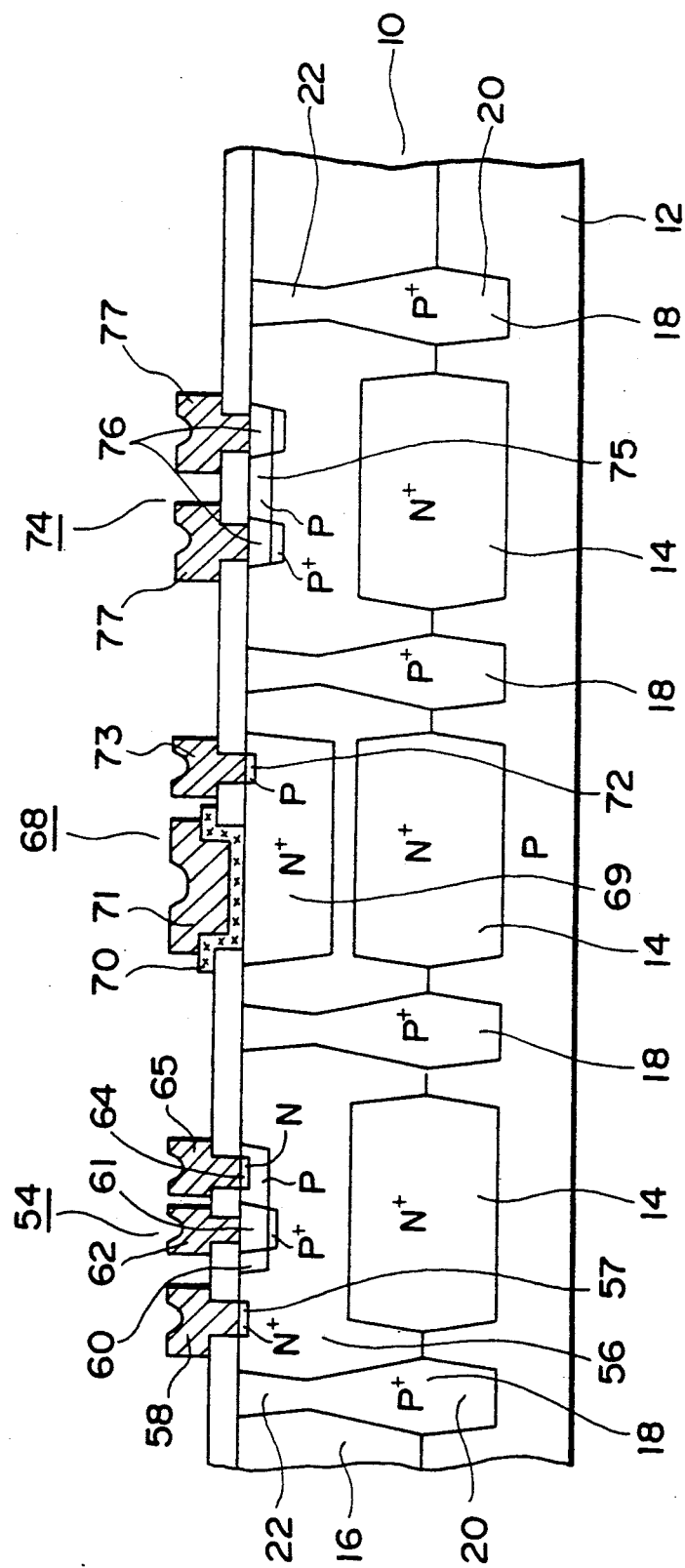

Now referring to FIG. 18, this drawing shows the cross section of a semiconductor integrated circuit 10 for which the masking steps have been completed. This drawing does not clearly indicate the distinguishing features of the present invention. However, in order for easy understanding of distinctive masking steps of this invention, an explanation of the cross sectional configuration of the semiconductor integrated circuit 10 as indicated in these drawings will first be presented.

This drawing illustrates a P-type semiconductor substrate 12; an N-type epitaxial layer 16 formed on the semiconductor substrate 12; a plurality of N+-type buried layers 14 formed by diffusion in the boundary region of the semiconductor substrate 12 and the N-type epitaxial layer 16; an isolating region 18 which reaches the surface of the epitaxial layer 16 from the upper side of the semiconductor substrate 12; and the configuration of each type of integrated circuit element (later discussed) within the epitaxial layer 16.

The plurality of isolating regions 18 are obtained by diffusing upward, to a depth of a little more than half the thickness of the epitaxial layer 16, a P+-type lower isolating region 20 formed on the surface of the semiconductor substrate 12 prior to growing the epitaxial layer 16, and by diffusing downward the P+-type upper isolating region 22 from the surface of the epitaxial layer 16 until it reaches the top of the lower isolating region 20. As illustrated in the drawing, the isolating regions 18 are formed to enclose the buried layer 14, and a plurality of electrically isolated islands is formed by the isolating regions 18. In order to clarify the corresponding relationships, common reference numbers have been used in the drawings preceding and subsequent to the diffusion of the lower and upper isolating regions 20, 22.

Also, a transistor 54, a MOS capacitive element 68, and a diffusion resistance element 74 are shown in these drawings as examples of the integrated circuit elements. A transistor 54 is shown formed from a collector region 56, which is the epitaxial region 16 itself, a base region 60, and an emitter region 64 within a first island formed by the isolating region 18. Within another island, a MOS capacitive element 68 is shown formed from a lower layer electrode region 69, a dielectric layer 70 formed on the upper layer of the electrode region 69, and upper layer electrode 71 formed on the upper layer of the dielectric layer 70. Within still another island, a diffusion resistance element 74 is shown formed from a diffused resistance region 75 on the surface of the epitaxial layer 16 and two contact regions 76 at each end of the diffused resistance region 75.

Now referring to drawings, the distinctive masking steps of the present invention will be explained. By these explanations, the embodiments of the present invention will be clarified. The various embodiments of the present invention have many parts of the masking steps in common. Therefore, to avoid unnecessarily lengthy explanations, and because it is usual that the various embodiments of the present invention are implemented in actual semiconductor integrated circuits in all or in combination optionally, the various embodiments are explained simultaneously.

Figure 1:
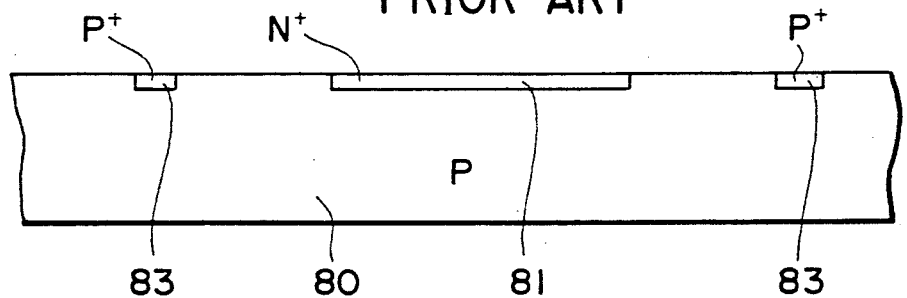
FIG. 1 to FIG. 4 are sectional drawings of a semiconductor integrated circuit substrate illustrative of each respective step in a conventional method of forming isolating regions.
Figure 2:
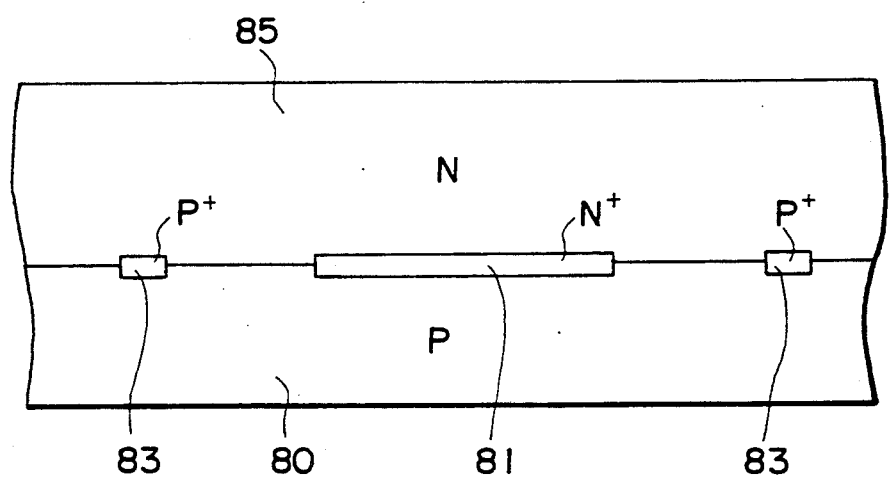
Figure 3:
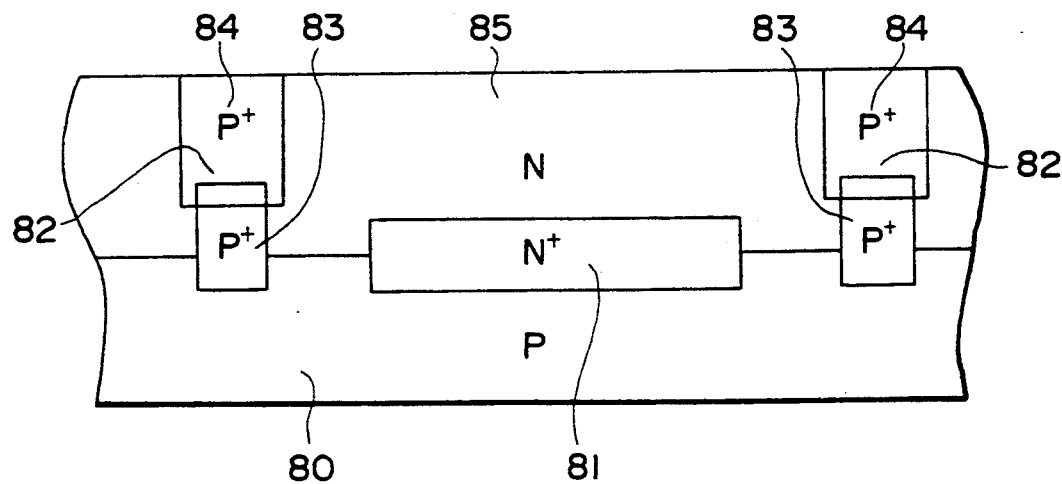
Figure 4:
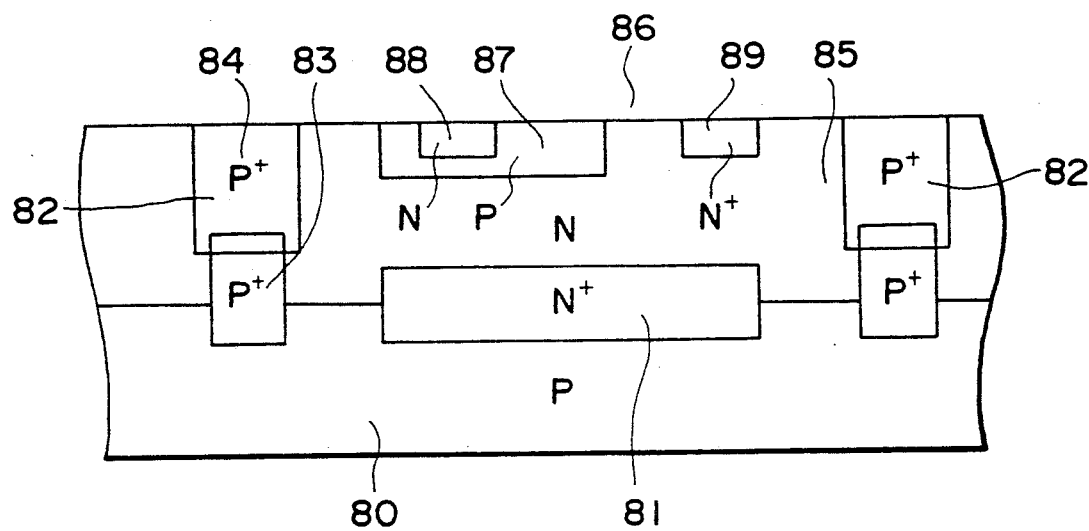
Figure 5:
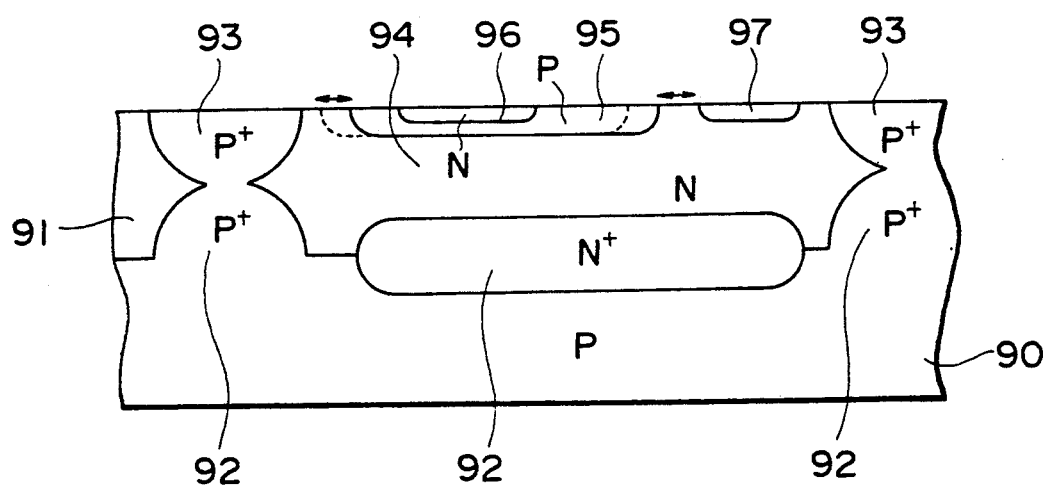
FIG. 5 is a sectional drawing of a bipolar transistor fabricated by a conventional method.
Figure 6:
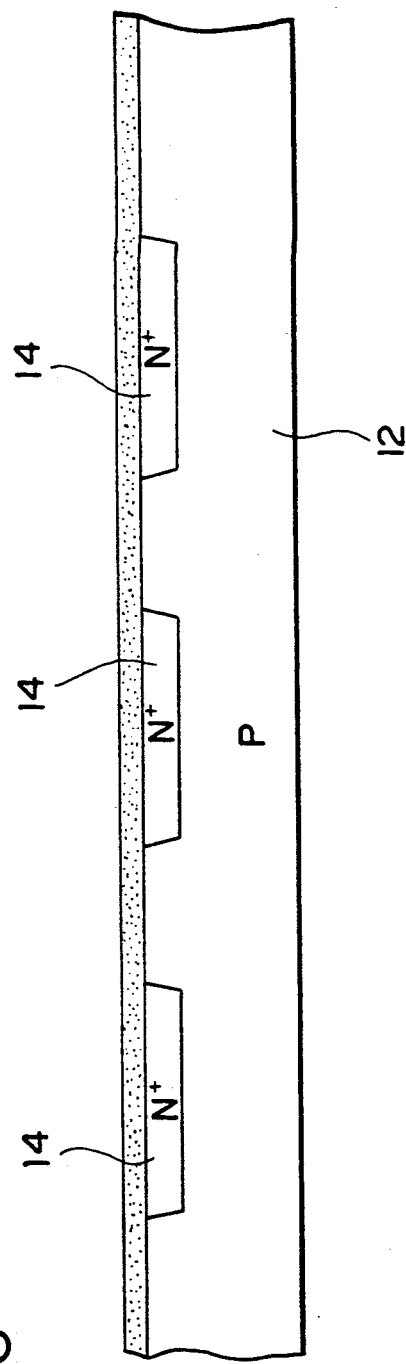

Now referring to FIG. 6, mainly, as a semiconductor substrate 12 which functions providing necessary strength in the manufacturing process, a P-type silicon semiconductor with impurity concentration of about $10^{15}$ atom/cm$^3$, and with a thickness of about 200 µm is used. An SiO$_2$ film is formed on the surface of the semiconductor substrate 12 by a commonly known thermal oxidation process, and a specified area of this SiO$_2$ film is opened by means of a commonly known photolithography (omitted from the drawings). Then the semiconductor substrate 12 is doped through the openings with antimony or arsenic, which are N-type dopants, to form the N+-type buried layers 14. FIG. 6 shows the cross sectional configuration of the semiconductor substrate 12 from which the SiO$_2$ film on the surface have been removed after the above process and on which again an SiO$_2$ film is newly formed. In the following explanation, it is proper that the layer which is subsequently subjected to a diffusion process is expressed as a buried layer. However, because this is very complicated, for the sake of simplicity the same representation and reference numbers are hereinafter used for the layer immediately after doping, and for the layer which is subsequently subjected to diffusion.

Figure 7:
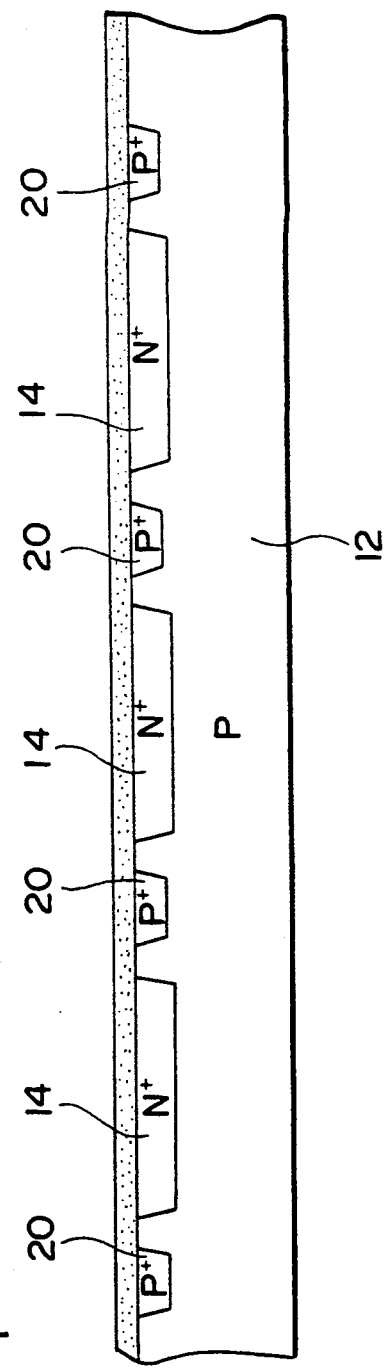

Next, an specified area of SiO$_2$ film which is newly formed is opened by photolithography in a different position from that of the previous SiO$_2$ film (omitted from the drawings). From this opening, boron, which is a P-type impurity, is introduced to dope the semiconductor substrate 12 to form a P+-type lower isolating region 20 (see FIG. 7). If a suitable mask is selected, the lower isolating region 20 can be doped with boron by the ion implantation method.

Figure 8:
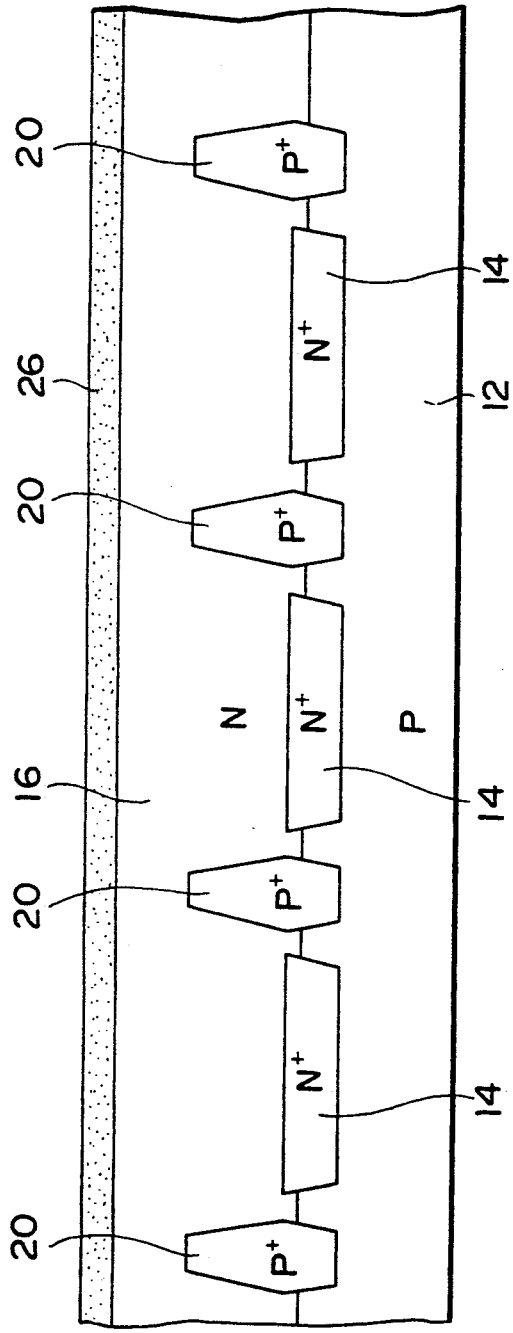

Now referring to FIG. 8, after the entire SiO$_2$ film has been removed from the semiconductor substrate 12, an N-type epitaxial layer 16 with a specific resistance of 0.1 to 5 Ω·cm is grown to a thickness of about 7 µm on the semiconductor substrate 12 by a commonly known vapor phase deposition method. Hereinafter, for the sake of simplicity, the semiconductor substrate 12 combined with a region or layer formed by the subsequent step, for example, the epitaxial layer 16, are referred to as the semiconductor substrate 12. During the growth of the epitaxial layer 16, the semiconductor substrate 12 is exposed to high temperatures, and the dopant which has previously been introduced to dope the semiconductor substrate 12 is diffused to a certain extent at that time. Subsequently, the semiconductor substrate 12 is subjected to thermal oxidation for several hours at a temperature of about 1000° C. to form an SiO$_2$ film 26 on the surface of the epitaxial layer 16, and maintained at about 1000° C. for an additional 2 hours approximately. In this step the lower isolating region 20 is diffused upward to a depth of a little more than half the thickness of the epitaxial layer 16 (about 5 µm from the substrate surface). As will be later explained, the present invention is characterized by this step in which the lower isolating region 20 is diffused in the upward direction to a depth of a little more than half the thickness of the epitaxial layer 16.

At this time, because the lower isolating region 20 is also diffused to the same extent in the lateral direction (on the drawing), if the width of the doping window for the lower isolating region 20 is, for example, 4 µm, the lower isolating region 20 reaches a maximum width of about 14 µm in subsequent steps. Accordingly, it is effective for improving the circuit integration that the maximum thickness of the lower isolating region 20 is restrained by forming the epitaxial layer 16 as a thin layer.

Also, by this step the SiO$_2$ film 26 on the surface of the epitaxial layer 16 is further grown to a thickness of several thousand angstroms, and is used as a mask for subsequent selective diffusion. This mask may also be a silicon nitride film, or the SiO$_2$ film which may newly be formed by the CVD process.

Figure 9:
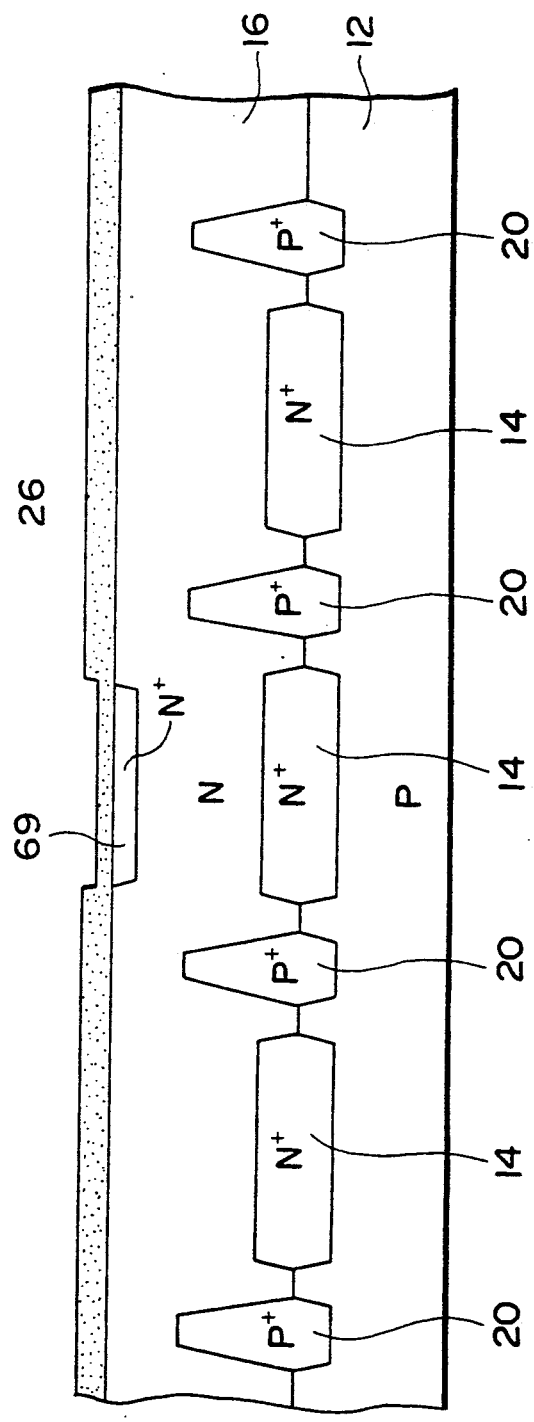

Then, an opening is created in a portion of the SiO$_2$ film 26 for the lower layer electrode region 69 of the MOS capacitive element 68 and, for example, phosphorous glass (omitted from the drawing) is formed over the entire surface of the semiconductor substrate 12. Then, by a heat treatment at a specific temperature and for a specific time, phosphorous is diffused from the above-mentioned opening into the epitaxial layer 16 to form an N$^+$-type lower layer electrode region 69. The phosphorous glass is then removed with a specified etchant, and the heat treatment is again performed to diffuse the phosphorus to a specified depth (See FIG. 9).

Subsequently, each potion of the SiO$_2$ film 26 for the upper isolating region 22, the base region 60, and the diffused resistance region 75 (none of which are shown on the drawing) are opened by means of photolithography using a positive-type resist film and dry etching, to form the respective doping windows 27, 29, and 30. The SiO$_2$ film 26 is a special feature of the present invention, and, compared to other SiO$_2$ films of the present invention, in particular, to those used in the conventional manufacturing method, it is commonly used in subsequent steps for a longer time.

Following this, the exposed epitaxial layer 16 is oxidized and dummy oxidation film 32 is formed to reduce damage to the epitaxial layer 16 from the subsequent ion implantation steps and to implant the impurity ions uniformly. (See FIG. 10).

Figure 11:
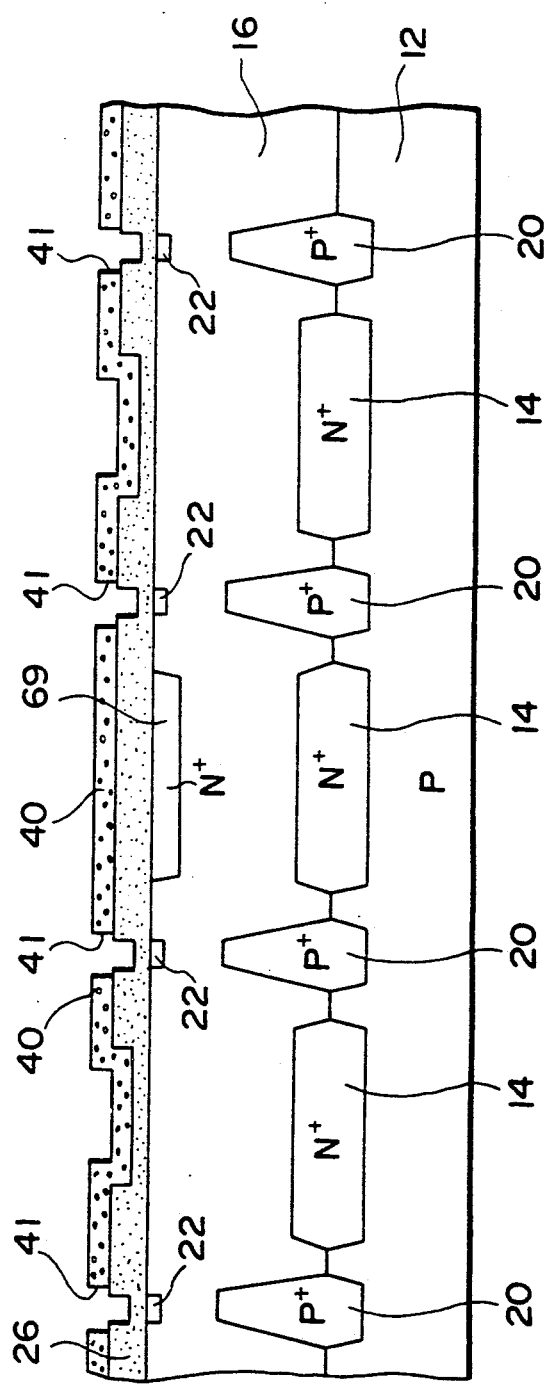

Next, as shown in FIG. 11, a resist film 40 which is capable of blocking ion implantation is formed on the upper section of the SiO$_2$ film 26 of the previous step, an opening is made in the upper section only of the upper isolating region 22, and boron is introduced under specified conditions through an open section 41 to form a P$^+$-type upper isolating region 22.

Figure 12:
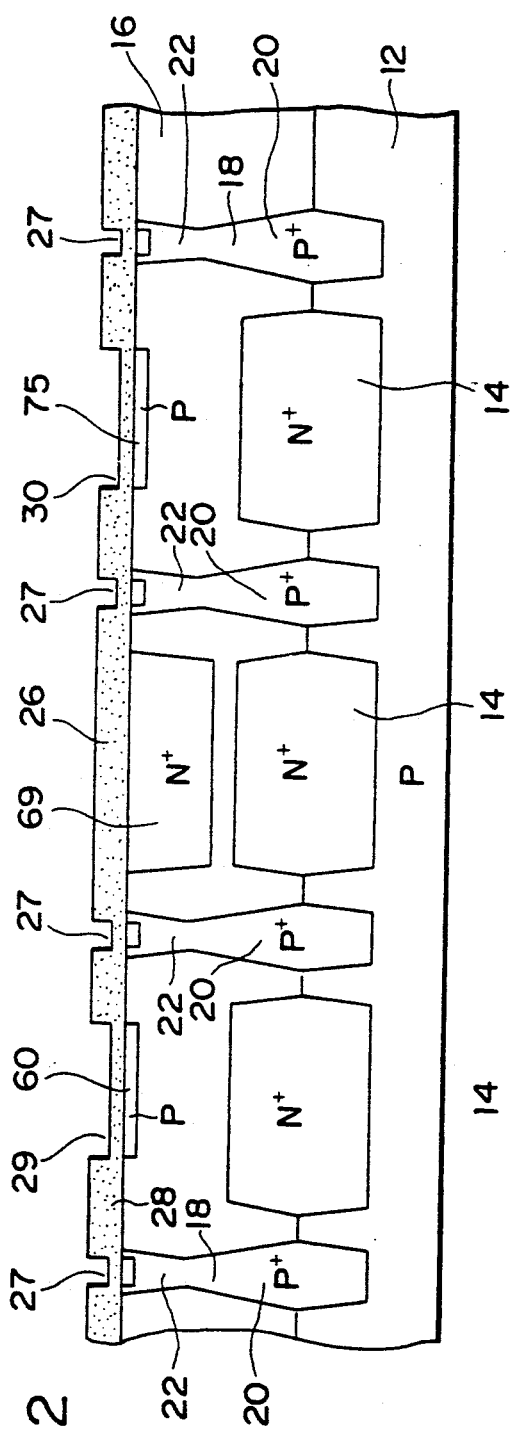

After the resist film 40 is removed, by subjecting the semiconductor substrate 12 to diffusion process under conditions such as, for example, about 1,200° C. for one hour, the upper isolating region 22 reaches the lower isolating region 20, and the both regions are linked to form the isolating region 18 as shown in FIG. 12.

The first embodiment of the present invention has the features of the steps outlined in FIG. 11 and FIG. 12. Specifically, in the first embodiment in which ion implantation is carried out for doping of the upper isolating region 22, retrogradation occurs in the dopant distribution in the upper isolating region 22 directly after ion implantation. The width of the upper isolating region 22 on the epitaxial layer 16 which is at its greatest width through the subsequent diffusion step can be narrowed. A high degree of integration is achieved in the semiconductor integrated circuit 10. In addition, because retrogradation occurs in the dopant distribution in the upper isolating region 22, the upper isolating region 22 and the lower isolating region 20 can be linked through a comparatively short-time, low-temperature diffusion step, whereby it is also possible to narrow the width of the upper isolating region 22 on the epitaxial layer 16, and accordingly achieve a high degree of integration in the semiconductor integrated circuit 10.

The second embodiment of the present invention has the features of the steps outlined in FIG. 8 previously explained and the steps outlined in FIG. 11 and FIG. 12. Specifically, in the second embodiment which is characterized by these steps, because the upper isolating region 22 and the lower isolating region 20 are formed in the respective diffusion processes, the diffusion conditions can optionally be designed so as to diffuse the lower isolating region 20 deeply and the upper isolating region 22 shallowly. The lateral diffusion of the upper isolating region 22 can be suppressed, and the width of the exclusive surface area of the upper isolating region 22 which directly affects the degree of integration of the semiconductor integrated circuit 10 can greatly be curtailed. Also, because the lower isolating region 20 which is formed by a longer period of diffusion than that used for the upper isolating region 22 is designed with a large cross section, a small amount of slippage of the mask can be tolerated during the period of formation of the upper isolating region 22. The upper isolating region 22 and the lower isolating region 20 are easily linked, and a complete isolation of junction is obtained.

The above first and second embodiments, implemented independently or simultaneously, contribute to a high degree of integration in the semiconductor integrated circuit 10.

Again referring to FIG. 12, boron (B) ions are implanted simultaneously through the doping windows 27, 29, 30 of the SiO$_2$ film 26 to form a base region 60 and a diffused resistance region 75. The base region 60 and the diffused resistance region 75 are then diffused by heat-treating under specified conditions.

In this stage, ions are simultaneously implanted into the upper isolating region 22 through the doping window 27 to improve the impurity concentration of the upper isolating region 22. Therefore, a resist film is not required, but only the SiO$_2$ film 26 is used as a mask.

The third embodiment of the present invention has the features related to the step described hereinbelow and to the steps in FIG. 11 and FIG. 13 mentioned above.

There is a restriction on manufacturing in this stage, by which the upper isolating region 22 and either the base region 60 or the diffused resistance region 75 must be designed in advance with a margin of distance enough to avert mutual contact during the subsequent diffusion process. Furthermore, in the conventional manufacturing method, the doping windows 29, 30 for the base region 60 and the diffused resistance region 75 are formed using a different mask than the mask used to form the doping window 27 for the upper isolating region 22. For this reason, adequate spacing must be designed between the upper isolating region 22 and these regions, considering the slippage for two masks.

By the third embodiment of the present invention which is characterized by the steps previously explained, the positioning of the doping windows 27, 30 is determined by a single mask, specifically, the SiO$_2$ film 26. Because the relative positions where the upper isolating region 22 and integrated circuit element regions such as, for example, the diffused resistance region 75 are formed is primarily determined, the spacing margin for the upper isolating region 22 and the resistance diffusion region 75 can be drastically reduced. In addition, in the third embodiment which features a reduced number of masking steps, the problems of contamination of and damage to the semiconductor substrate during the manufacturing stage are eliminated.

Similarly, by the fourth embodiment of the present invention, the positioning of the doping windows 27, 29 is determined by a single mask, specifically, the SiO₂ film 26. Because the relative positions where the upper isolating region 22 and the base region 60 of a transistor are formed is primarily determined, the spacing margin for the upper isolating region 22 and the base region 60 of the transistor can be drastically reduced. This effect is remarkable, especially, when integrating many transistors.

The distance for lateral diffusion of the upper isolating region 22 is usually 0.8 times that for vertical diffusion, so that the upper isolating region 22 and the regions for the various integrated circuit elements can be rationally designed at 0.8 times or greater the vertical diffusion distance of the upper isolating region 22.

Referring to FIG. 11, for example, the present invention in which ion implantation is carried out through the SiO₂ film 26 and the resist film 40 has the advantage that slippage of the mask patterns for the SiO₂ film 26 and the resist film 40 can be tolerated. Specifically, the ions implanted from the open section 41 of the resist film 40 are finally implanted in the surface of the epitaxial layer 16 according to the mask pattern of the SiO₂ film 26. Therefore, the resist layer 40 is adequate if it has the function of shielding the doping windows 29, 30 of the base region 60 and the diffused resistance region 75 respectively. A precise mask alignment is unnecessary. Accordingly, it is desirable that the open section 41 of the resist film 40 be formed slightly larger than the doping window 27 in the lower section of SiO₂ film 26, as in the resist film 40 shown in FIG. 11.

Figure 13:
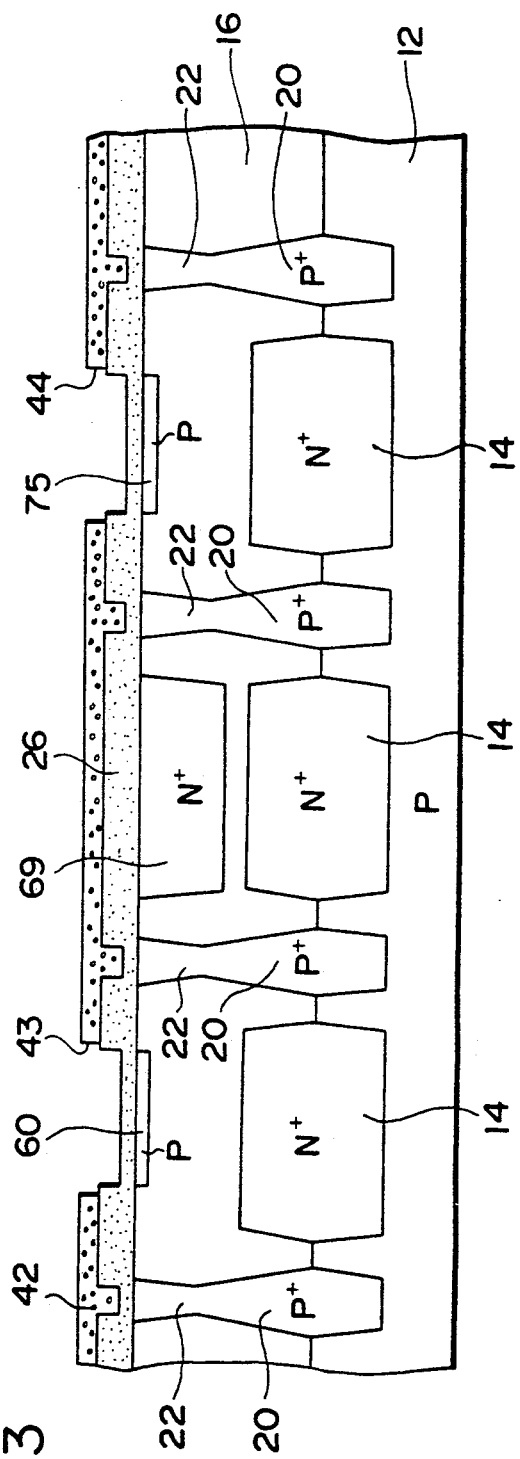

FIG. 13 shows a modification of the embodiment of the step of FIG. 12. In the step related to FIG. 12, dopants are again added to the upper isolating region 22. However, as shown in FIG. 13, excessive doping of the upper isolating region 22 can be avoided when using the resist film 42 in which the doping windows 43, 44 are opened only in the areas of the respective upper sides of the base region 60 and the diffused resistance region 75.

However, the impurity concentration of the isolating region 18 must usually be high. This is because of reducing the resistance of the isolating region 18, whereby the voltage difference of the isolating region 18 from the semiconductor substrate which acts as a ground can be decreased and the generation of parasitic transistors can be prevented. In light of this, usually, when implanting ions into the base region 60, ions are again implanted into the upper isolating region 22 to heighten the impurity concentration of the isolating region 18.

Following the step related to FIG. 12, a new resist film 46 is formed on the SiO₂ film 26 and openings for the upper isolating region 22, a base contact region 61, and a pair of contact regions 77 of a diffusion resistance element 74 are formed by photolithography on their respective upper sections, to form the respective doping windows 47, 48, 49. Then, boron (B) ions are implanted in the epitaxial layer 16 through the doping window of the resist film 46 and the SiO₂ film 26 to form a P-type base contact region 61 and two contact regions 77. (See FIG. 14). In this step, also, ions are again implanted into the upper isolating region 22 to heighten the impurity concentration.

Following this step, the resist film 46 is removed and the semiconductor substrate 12 is subjected to a specified heat treatment to diffuse the base region 60, the diffused resistance region 75, the base contact region 61, and the two contact regions 77 which all have been doped up to this point.

Following to the above process, as shown in FIG. 15, the previous resist film 46 is removed, and all of the above-mentioned SiO₂ film 26 on the epitaxial layer 16 is selectively etched or the SiO₂ film 26 is etched to a thickness of about 1,000 angstroms. After this process, layers of a non-doped SiO₂ film 26 and a phosphorous-doped SiO₂ film are respectively laminated to form a uniform film with a thickness of about several thousand angstrom on the entire surface of the epitaxial layer 16 or the SiO₂ film 26. Because the SiO₂ film of the this step includes the SiO₂ film of the previous step occasionally, the same reference number is used.

The above-mentioned step is a remarkable feature of the present invention. Specifically, by the conventional method in which the SiO₂ film 26 as shown in FIG. 14 is used, there is a problem of progressing side etching of the upper section of the emitter region by the time when the etching of the SiO₂ film 26 in the upper section of the collector contact region is completed in the subsequent step wherein the doping window for the collector contact region is formed in the SiO₂ film 26, because the SiO₂ film 26 corresponding to a collector contact region (not shown in FIG. 14) is thicker than that of the emitter region 64. However, in the present invention, a portion of SiO₂ film 26 corresponding to the collector contact region 64 is formed in advance with the same thickness as that of a portion of the SiO₂ film for the emitter region 64. Therefore, the etching of both of the portions can be finished simultaneously. In addition, the etching of the emitter region 64 itself is avoided.

Figure 16:
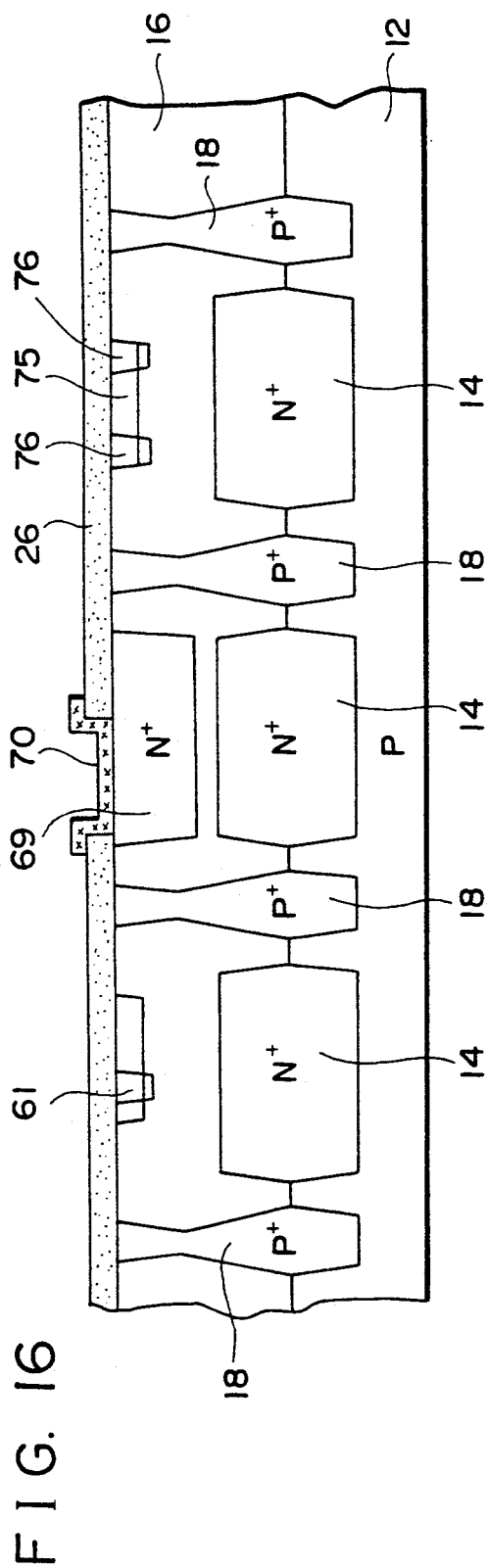

Following the step related to FIG. 15, a portion of the SiO₂ film 26 for a dielectric layer of a MOS capacitive element is opened by means of photo-lithography using a negative photoresist and wet etching. After a nitride SiO₂ film is formed with a thickness of several hundred angstroms on the entire surface of the semiconductor substrate, it is etched by means of chemical dry etching to form a dielectric layer 70 as shown in FIG. 16.

Figure 17:
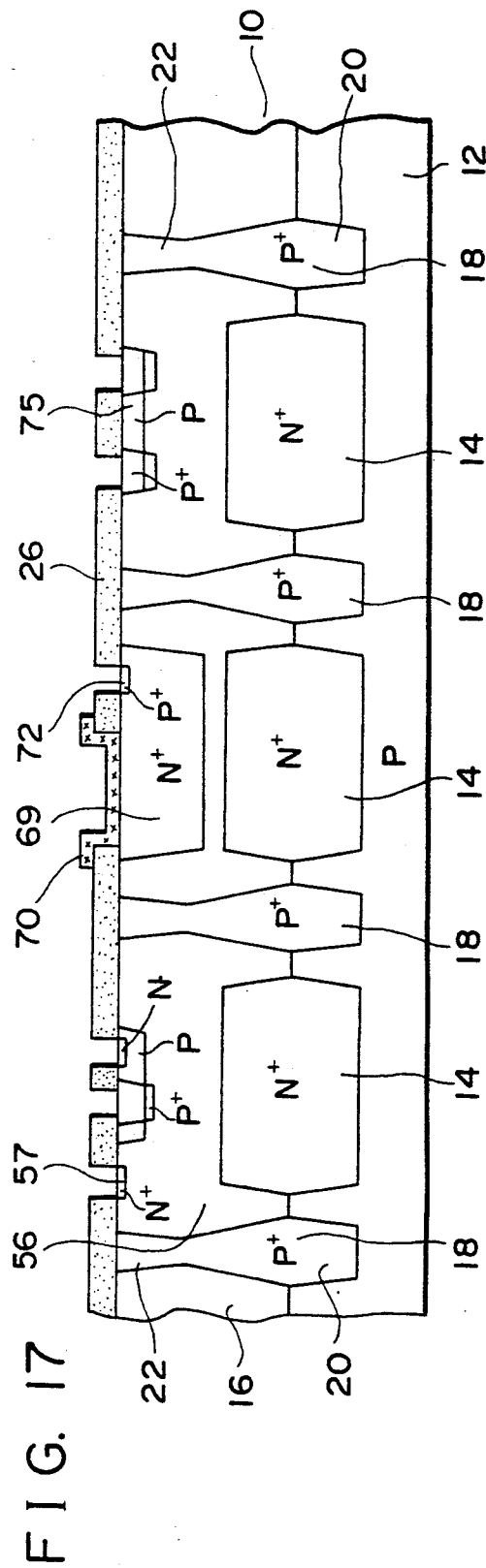

Next, each portion of the SiO₂ film 26 for an emitter region 64, a collector contact region 57, the contact region 72 of a lower layer electrode 69, and the contact region 76 of a diffused resistance region 75 is opened by means of anisotropic etching. After that, a resist film (not shown in the drawing) is formed on the entire surface of the SiO₂ film 26 and each upper section of an emitter region 64, a collector contact region 57, and the contact region 72 of a lower layer electrode 69 is opened. Arsenic is ion implanted using the photoresist and the SiO₂ film 26 as a mask to form the emitter region 64, the collector contact region 57, and the contact region 72 of the lower layer electrode 69 (See FIG. 17).

Finally, after the above resist is removed and heat-treatment is carried out to diffuse downward the emitter region 28, followed by light etching to form aluminum electrodes 58, 62, 65, 71, 73, 77 as shown in FIG. 18.

In the above processes for manufacturing a semiconductor integrated circuit, the collector contact region 57 is formed after the SiO₂ film 26 has been formed. However, a doping window for the collector contact region 57 can be formed simultaneously at the time when the doping windows 27, 29, 30 are formed in the step related to FIG. 10.

Referring to FIG. 19 to FIG. 25, a modification of the above embodiment realizing the above point is explained hereinafter.

Figure 10:
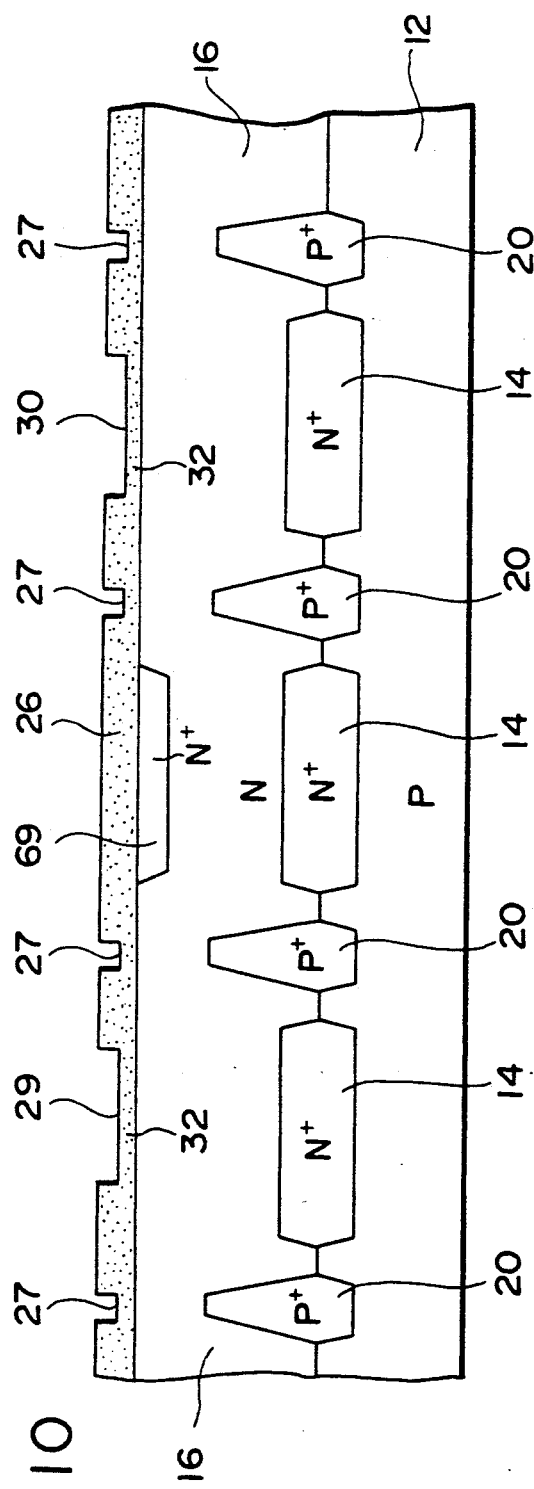
Figure 19:
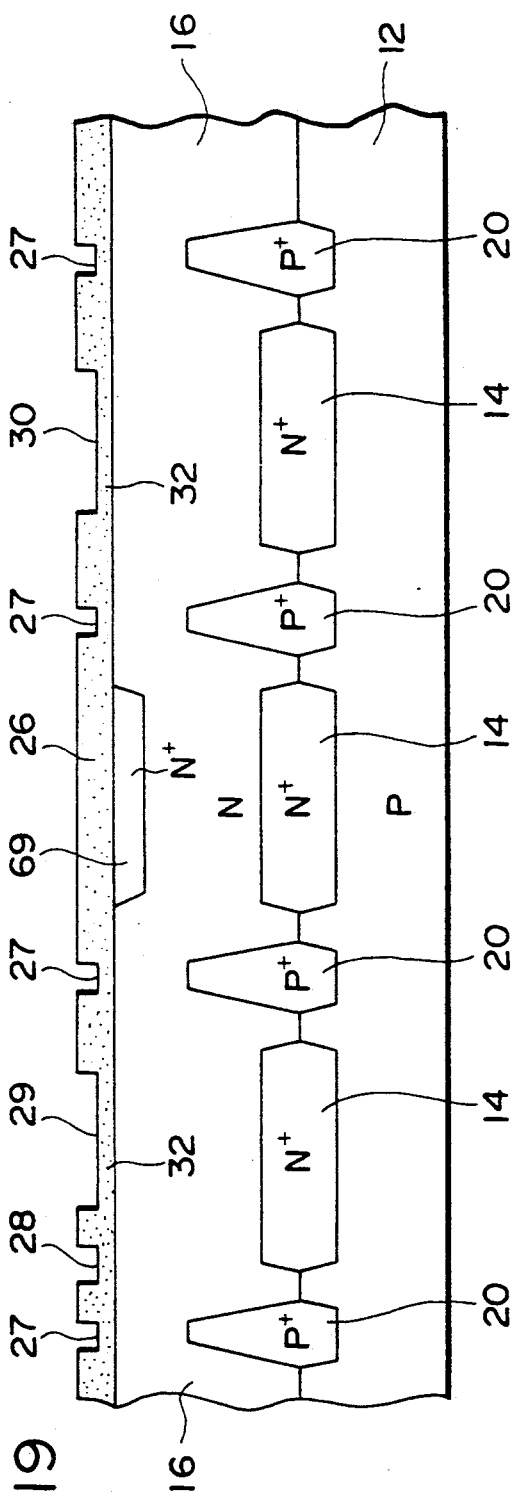
FIG. 19 to FIG. 25 are drawings explaining the modification of steps in the manufacture of an embodiment illustrated in FIG. 10 to FIG. 17.

FIG. 19 shows a step corresponding to that of FIG. 10 previously explained. In the present step, each portion of the SiO$_2$ film 26 for the upper isolating region 22, the collector contact region 57, the base region 60, and the diffused resistance region 75 (All regions are not shown in the drawing) to form respective windows 27, 28, 29, 30 by means of photolithography using a positive-type resist film and dry etching.

Following this, the exposed epitaxial layer 16 is oxidized and dummy oxidation film 32 is formed to reduce damage to the epitaxial layer 16 from the subsequent ion implantation steps and to implant the impurity ions uniformly. (See FIG. 19).

Figure 20:
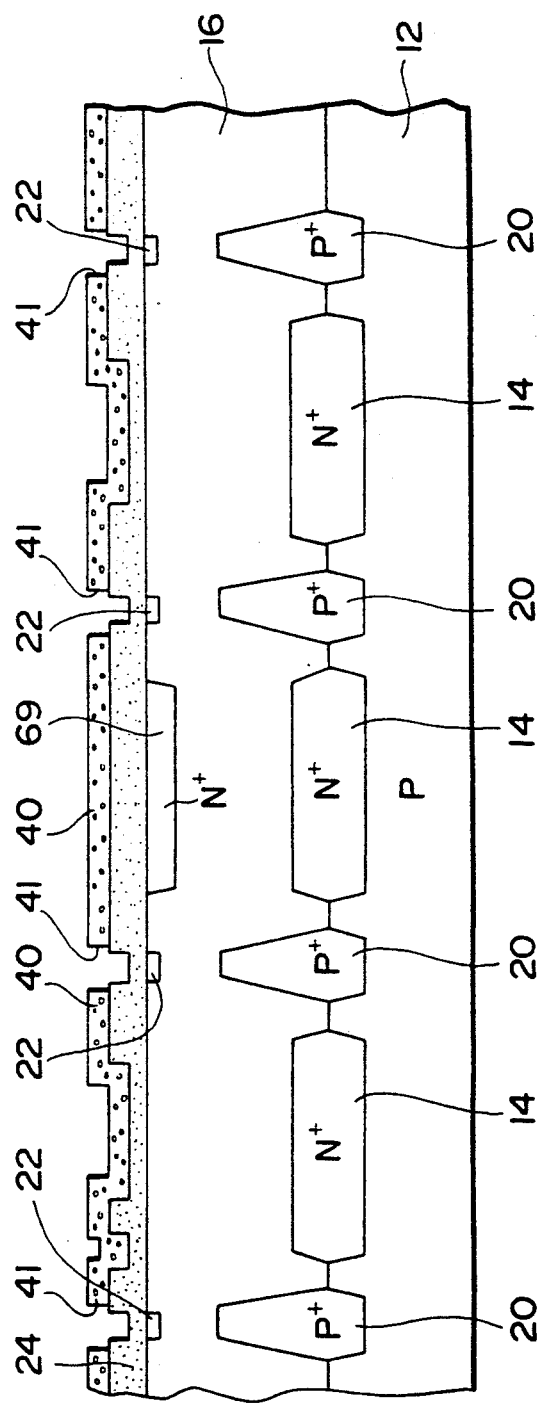

Next, as shown in FIG. 20, a resist film 40 capable of blocking ion implantation is formed on the upper section of the SiO$_2$ film 26 of the previous step, an opening is made for the upper section only of the upper isolating region 22, and boron is introduced under specified conditions through the open section 41 to form a P$^+$-type upper isolating region 22.

Figure 21:
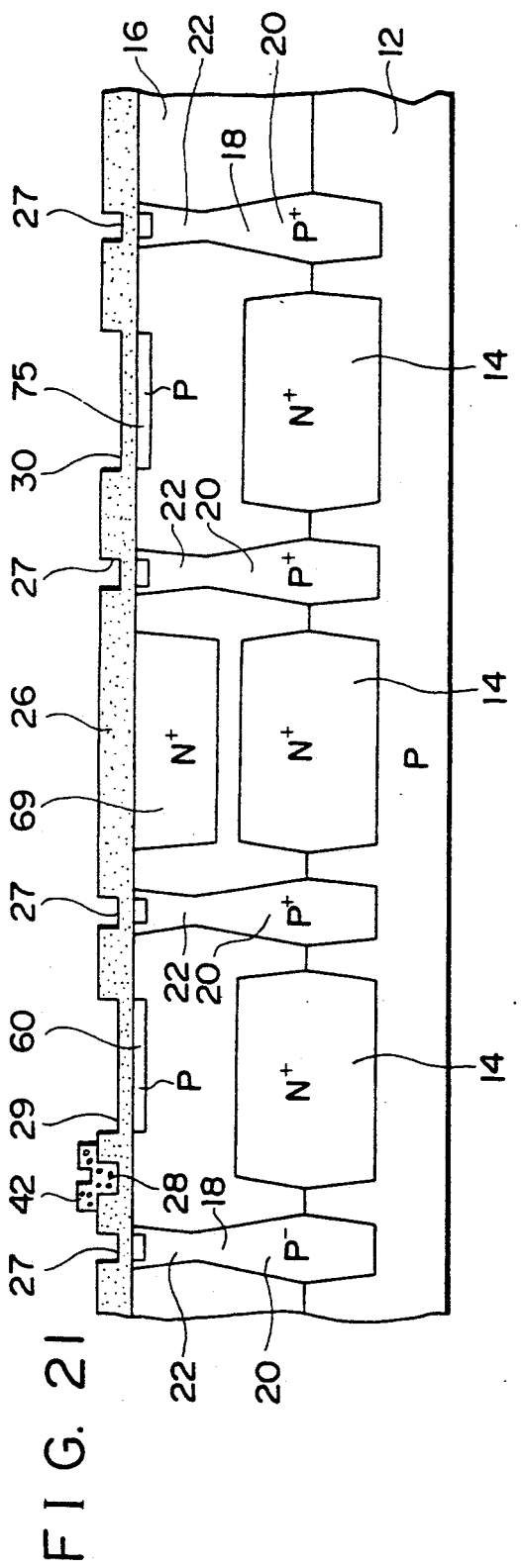

After the resist film 40 is removed, the semiconductor substrate 12 is subjected to diffusion process under conditions such as, for example, about 1,200° C. for one hour so that the upper isolating region 22 reaches the lower isolating region 20, and, as shown in FIG. 21, the both regions are linked to form the isolating region 18.

Again referring to FIG. 21, in this step, the SiO$_2$ film 26 in the upper section of the collector region 57 of the transistor 54 is coated with a resist film 42 capable of blocking ion implantation. Boron (B) ions are implanted simultaneously through the doping windows 27, 29, 30 of the SiO$_2$ film except for the doping window 28 for the collector contact region 57 to form a base region 60 and a diffused resistance region 75. The base region 60 and the diffusion resistance region 75 are then heat-treated under specified conditions and diffused.

Figure 22:
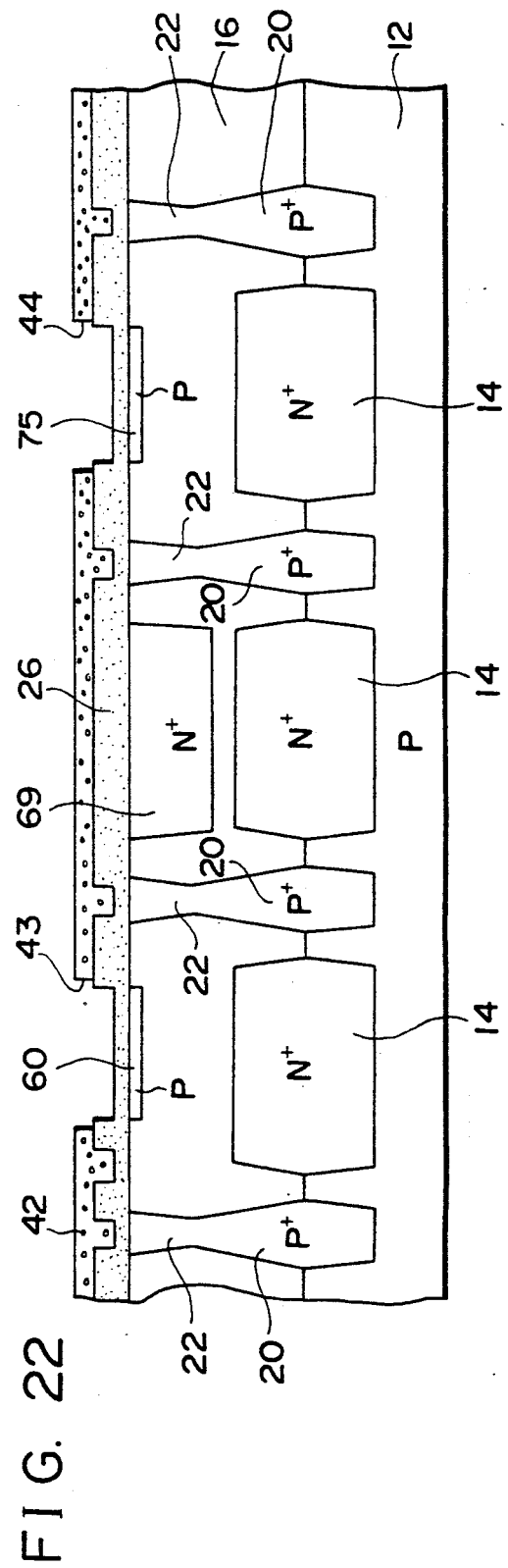
Figure 23:
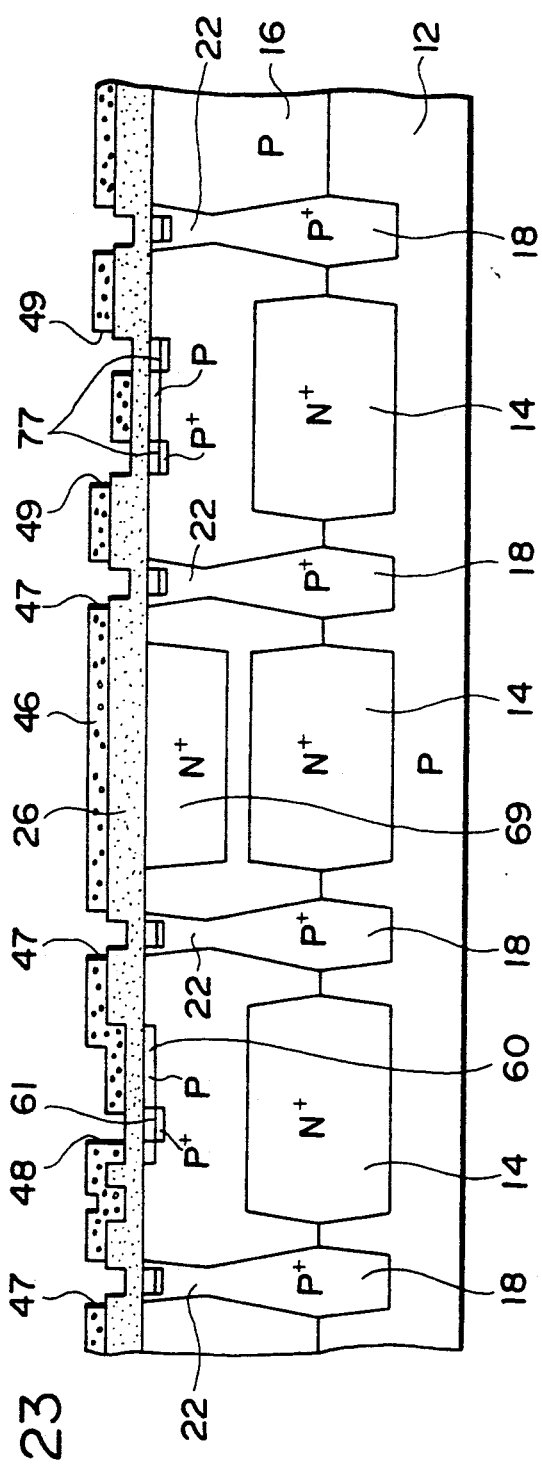
Figure 24:
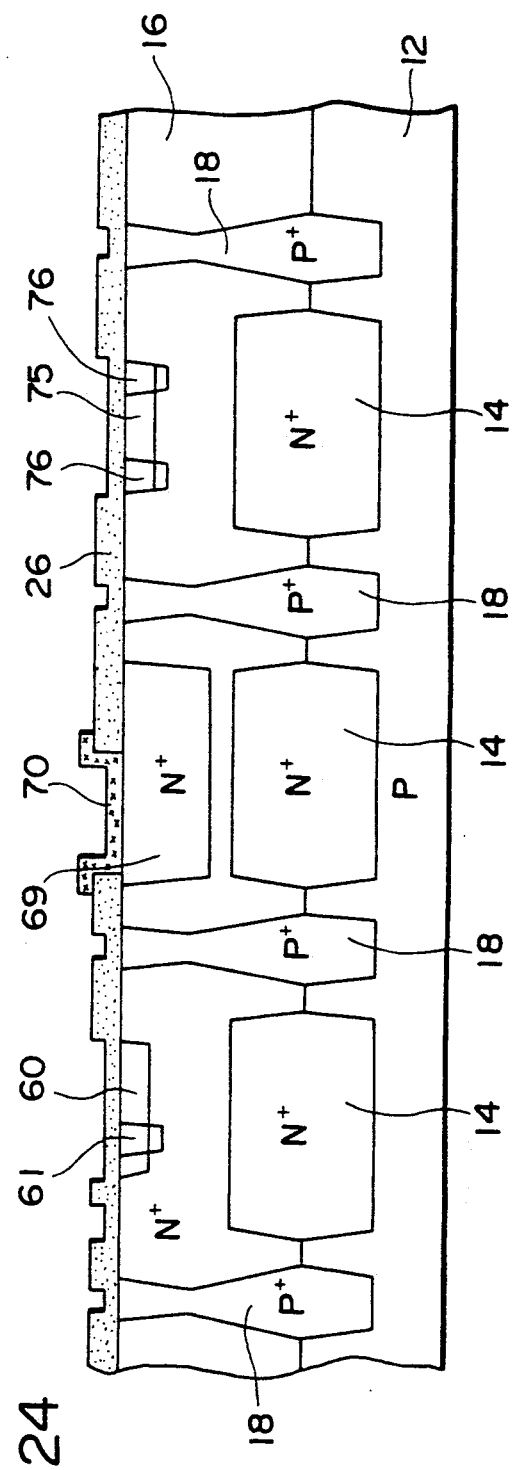
Figure 25:
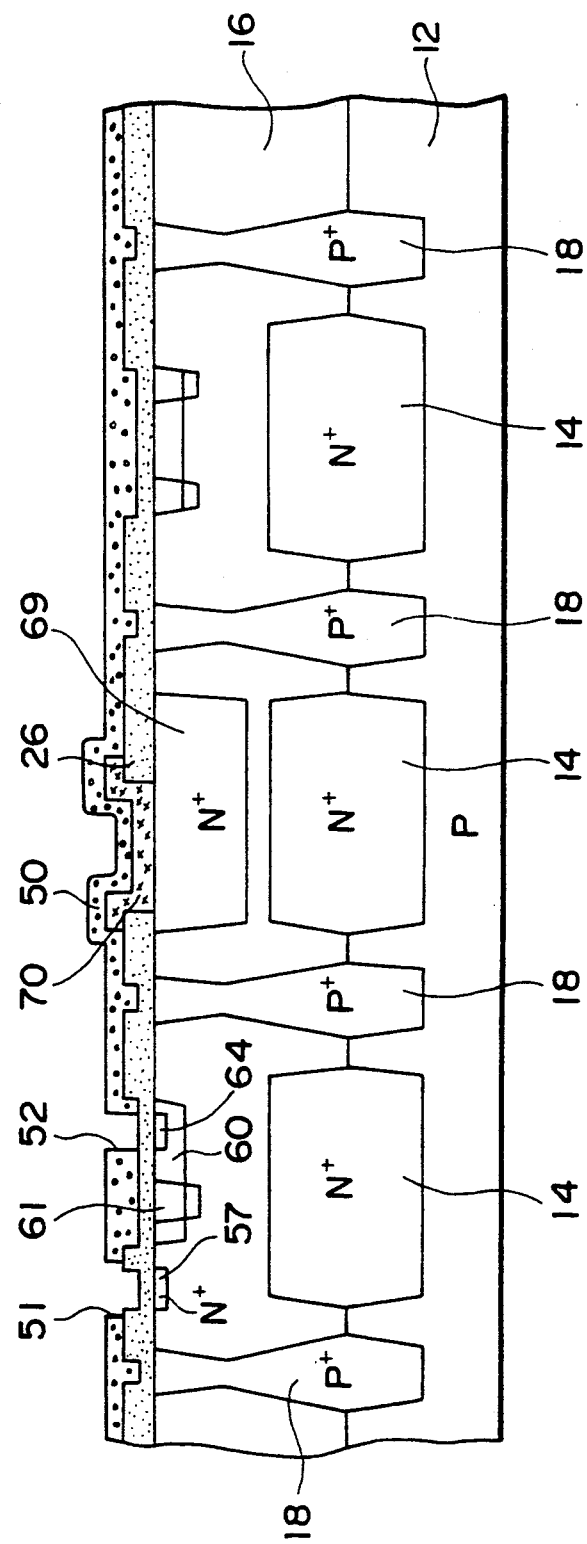

FIG. 22 shows a modification of the embodiment of the step of FIG. 21. In the step related to FIG. 21, dopants are again added to the upper isolating region 22. However, as shown in FIG. 22, excessive doping of the upper isolating region 22 can be avoided when using the resist film 42 in which the doping windows 43, 44 are opened only in the areas of the respective upper sides of the base region 60 and the diffused resistance region 75.

Following the step related to FIG. 21, a new resist film 46 is formed on the SiO$_2$ film 26 and the openings for the upper isolating region 22, a base contact region 61, and a pair of contact regions 77 of a diffusion resistance element 74 are formed by photolithography, to form the respective doping windows 47, 48, 49. Then, boron (B) ions are implanted in the epitaxial layer 16 through the doping window of the resist film 46 and the SiO$_2$ film 26 to form a P-type base contact region 61 and two contact regions 77. (See FIG. 23). Following this step, the resist film 46 is removed and the semiconductor substrate 12 is subjected to a specified heat treatment to diffuse the base region 60, the diffused resistance region 75, the base contact region 61, and the two contact regions 77 which all have been doped up to this point.

An opening is made in the SiO$_2$ film 26 for a dielectric layer 70 of the MOS capacitive element 68 by means of photoresist using a negative photoresist and wet etching. Then, a thick-film silicon nitride film of several hundred angstroms is formed over the entire surface of the semiconductor substrate 12 and etched by a chemical dry-etching method to form the dielectric layer 70 of the shape shown in FIG. 24.

Further, a new resist film 50 is formed on the SiO$_2$ film 26, and the upper sections of the collector contact region 57 and the emitter region 64 are opened through respective impurity-introduction windows 51, 52. Then, arsenic (As) or phosphorous (P) ions are implanted in the epitaxial layer 16 through the doping window of resist film 50 and the SiO$_2$ film 26 to form an N$^+$-type collector contact region 57 and an emitter region 64 (See FIG. 25).

The special feature of the fourth embodiment of the present invention is represented by this step in which the collector contact region 57 and the emitter region 64 are self-aligned by the SiO$_2$ film 26.

The reason why the collector contact region 57 and the emitter region 64 are formed after the diffusion of the base region 60 and the base contact region 61 is to avoid contact of the collector contact region 57 and the emitter region 64 from the simultaneously lateral diffusion of the collector contact region 57 in the case where the base region 60 and the base contact region 61 are diffused after the collector contact region 57 has been formed. Accordingly, when the collector contact region 57 and the emitter region 64 are positioned at a sufficient distance, a modification is possible whereby, after formation of the collector contact region 57, the diffusion process can be performed on the base region 60 and the base contact region 61.

It is also possible to form the N$^+$-type collector contact region 57 and the N$^+$-type emitter region 64 by the conventional deposit, diffusion techniques rather than by ion implantation technique. In that case, the step of the present invention of forming the collector contact region 57 and the emitter region 64 also gives the desired special features.

Specifically, when the collector contact region 57 and the emitter region 64 are formed by the deposit and diffusion technique, the SiO$_2$ film 26 is etched at a specified position to expose the epitaxial layer 16. In the conventional manufacturing method, because a portion of the SiO$_2$ film 26 for the collector contact region 57 is thicker than that for the emitter region 64, there is the problem that side etching of the portion of the SiO$_2$ film 26 for the emitter region 64 occurs when the etching of the portion of the SiO$_2$ film 26 for collector contact region 57 is completed. However, with the present invention, a portion of the SiO$_2$ film 26 for the collector contact region 57 is formed in advance with the same thickness as that of a portion of the SiO$_2$ film 26 for the emitter region 64, and the etching of the portion of the SiO$_2$ film 26 for the emitter region 64 and the etching of the portion of the SiO$_2$ film 26 for the collector contact region 57 are completed at the same time. The above-mentioned problem is therefore eliminated. Also, the etching of the emitter region 64 itself is avoided.

The special features of the fifth embodiment of the present invention are, as outlined above, that the doping windows are all formed in advance in specific positions of the SiO$_2$ film 26, ion implantation is performed without selectively opening the SiO$_2$ film 26, and the selective etching of the SiO$_2$ film 26 for selective deposition and diffusion is completed at the same time at all the doping windows.

As outlined in the foregoing explanation, in the first embodiment in which the impurity doping of the upper isolating region is carried out by means of ion implantation, the distribution of the dopant in the upper isolating region 22 retrogrades directly after the ion implantation whereby it is possible to reduce the width of the upper isolating region on the surface of the epitaxial layer, which reaches its maximum width in the subsequent diffusion step, and a semiconductor integrated circuit with a high degree of integration is achieved. In addition, because of the retrogradation of the distribution of the dopant in the upper isolating region, the upper and lower isolating regions are linked by means of a diffusion step at a low temperature over a comparatively short time. The width of the upper isolating region on the surface of the epitaxial layer can be reduced, and accordingly, a semiconductor integrated circuit with a high degree of integration is achieved.

By the second embodiment of the present invention, because the upper and lower isolating regions are formed by different diffusion processes respectively, it is possible to optionally design the respective diffusion conditions so as to deepen the diffusion depth of the lower isolating region and to shallow the diffusion depth of the upper isolating region. By this means, the lateral diffusion of the upper isolating region can be restrained, and it is possible to curtail the width of the exclusive surface area of the upper isolating region which affects the degree of integration of the semiconductor integrated circuit. Also, because the lower isolating region is designed with a large cross section formed by a longer period of diffusion than that used for the upper isolating region, a small amount of slippage of the mask can be tolerated during the period of formation of the upper isolating region. The upper isolating region and a lower isolating region are easily linked, and a complete isolation of junction is obtained.

By the third embodiment of the present invention, because the positions of the respective impurity introduction windows are set in advance by a single $SiO_2$ film which may be called as a reference mask, and the positions at which the upper isolating region and the integrated circuit element regions, e.g. a diffused resistance region are formed are primarily determined, the spacing margin of the upper isolating region and the diffused resistance region or the like can be set to an extremely small size. In addition, by the third embodiment in which the number of masking steps is reduced, the problems of the contamination of and damage to the semiconductor substrate during the manufacturing stage are eliminated.

Also, the third embodiment, in which ion implantation is carried out via the $SiO_2$ film called as a reference mask and the resist film, has the advantage that slippage of the mask pattern for the resist film and the $SiO_2$ film can be tolerated. Specifically, the ions which are implanted from the opening in the resist film are finally implanted in the surface of the epitaxial layer according to the mask pattern of the $SiO_2$ film. Accordingly, the resist layer is adequate if it has the function of shielding only the doping windows for regions in which ions are not implanted. This embodiment has the advantage that a precise mask alignment is unnecessary.

By the fourth embodiment of the present invention, in addition to the effects previously outlined, the self-alignment of an upper isolating region and a base region of a transistor or other regions is assured, and it is unnecessary to provide an excess spacing margin between the upper isolating region and the other regions. The degree of integration of the semiconductor integrated circuits is also increased. This embodiment exhibits an outstanding effect on the integration of many transistors.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a semiconductor integrated circuit comprising steps of:
    (i) forming a lower isolating region constituting one side of an isolating region between a semiconductor substrate and an epitaxial layer formed on the semiconductor substrate;
    (ii) diffusing the lower isolating region;
    (iii) forming a first mask layer consisting of a thermal oxide film on the surface of the epitaxial layer, and opening portions of the first mask layer for an upper isolating region and a base region of a transistor to form each doping window;
    (iv) forming a second mask layer on the first mask layer, and opening portions of the second mask layer for the doping windows of the first mask layer for the upper isolating region to form doping windows;
    (v) ion implanting into the epitaxial layer through the doping windows of the first and second layers to form the upper isolating region;
    (vi) diffusing the upper isolating region after removing the second mask layer; and
    (vii) ion implanting a dopant through the first mask layer having the opening portions for the base region and for the isolating region, and diffusing the implanted dopant.

2. The method of manufacturing a semiconductor integrated circuit of claim 1, wherein the lower isolating region is diffused upward to a depth of little more than half the thickness of the epitaxial layer.

3. The method of manufacturing a semiconductor integrated circuit of claim 1, wherein the diffusion depth of the lower isolating region is greater than that of the upper isolating region.

4. The method of manufacturing a semiconductor integrated circuit of claim 1, wherein the size of each doping window of the first mask layer is larger than that of each corresponding doping window of the second mask layer.

5. The method of manufacturing a semiconductor integrated circuit of claim 1, wherein the upper isolating region and the base region of the transistor are laterally isolated.

6. The method of manufacturing a semiconductor integrated circuit of claim 1, wherein the distance in the lateral direction between the upper isolating region and the base region is at least 0.8 times as long as the diffusion depth of the upper isolating region.

7. The method of manufacturing a semiconductor integrated circuit of claim 1, wherein the base region of the transistor is used as a diffused resistance element region.

8. A method of manufacturing a semiconductor integrated circuit comprising steps of:

(i) forming a lower isolating region constituting one side of an isolating region between a semiconductor substrate and an epitaxial layer formed on the semiconductor substrate;

(ii) diffusing the lower isolating region to a depth of a little more than half the thickness of the epitaxial layer;

(iii) forming a first mask layer on the surface of the epitaxial layer, and opening portions of the first mask layer for the upper isolating region, a base region of a transistor, and a collector contact region to form each doping window;

(iv) forming a second mask layer on the first mask layer, and opening a portion of the second mask layer for the upper isolating region to form a doping window;

(v) ion implanting into the epitaxial layer through the doping window of the first and second mask layers to form the upper isolating region;

(vi) forming a third mask layer on the first mask layer after removing the second mask layer, and opening portions of the third mask layer for the upper isolating region and the base region of the transistor to form each doping window; and (vii) doping the epitaxial layer with an impurity to form the base region of the transistor.

9. The method of manufacturing a semiconductor integrated circuit of claim 8, wherein step (iii) is characterized by opening respective portions of the first mask layer for the upper isolating region, the base region of the transistor, a collector contact region, and a resistance region.

10. The method of manufacturing a semiconductor integrated circuit of claim 8, after step (vii), further comprising the steps of:

forming a fourth mask layer on the first mask layer after the third mask is removed, and opening each portion of the fourth mask layer for at least the base contact region of the transistor to form each doping window; and doping the epitaxial layer with an impurity through the first and fourth mask layers to form at least the base contact region of the transistor.

11. The method of manufacturing a semiconductor integrated circuit of claim 10, wherein the doping of the base contact region is implemented by means of ion implanting.

12. The method of manufacturing a semiconductor integrated circuit of claim 10, wherein an impurity is ion implanted into the upper isolating region simultaneously when an impurity is ion implanted into the base contact region.

* * * * *